United States Patent [19]
Xu et al.

[11] Patent Number: 5,278,535
[45] Date of Patent: Jan. 11, 1994

[54] ELECTRICAL OVERSTRESS PULSE PROTECTION

[75] Inventors: Antai Xu, Camarillo; Roger C. Stephenson, Woodland Hills, both of Calif.

[73] Assignee: G&H Technology, Inc., Camarillo, Calif.

[21] Appl. No.: 928,034

[22] Filed: Aug. 11, 1992

[51] Int. Cl.⁵ .............................. H01C 7/10
[52] U.S. Cl. ..................... 338/20; 338/21; 338/220; 338/221; 338/276; 338/322; 361/117; 361/127; 428/209; 428/659; 428/901
[58] Field of Search ............. 338/20, 21, 220, 221, 338/317, 306, 276, 322, 325; 428/432, 433, 411.1, 450, 418, 209, 901, 658, 659, 681; 361/56, 117, 118, 121, 126, 127

[56] References Cited

U.S. PATENT DOCUMENTS

| | | | |
|---|---|---|---|
| 3,740,701 | 6/1973 | Harnden, Jr. | 338/21 X |
| 5,006,950 | 4/1991 | Allina | 361/117 |
| 5,183,698 | 2/1993 | Stephenson et al. | 428/209 |

Primary Examiner—Marvin M. Lateef
Attorney, Agent, or Firm—Boris Haskell

[57] ABSTRACT

A thin flexible laminate for overlay application on the pins of a connector or other circuit element, having an electrically insulating substrate, a conductive lamina of apertured pin receiving pads and a separate ground strip adjacent the pads, and an electrically insulating cover lamina, the substrate and cover having apertures aligned with the pad apertures, the cover having second apertures exposing adjacent edges of said pads and ground strip, with an electrical overstress pulse responsive composite material positioned in the second apertures and bridging the pads and the ground strip.

19 Claims, 3 Drawing Sheets

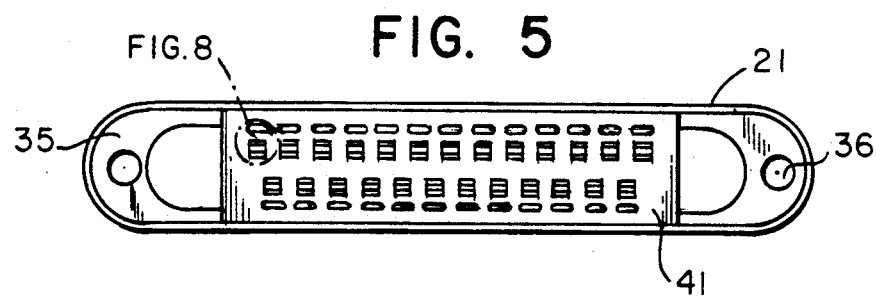
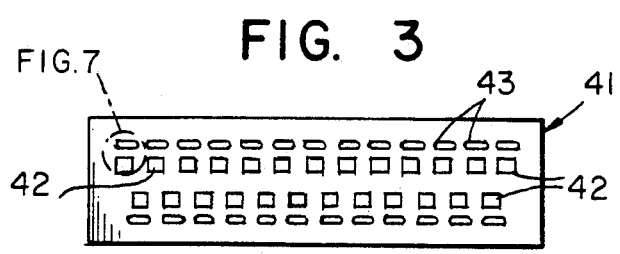
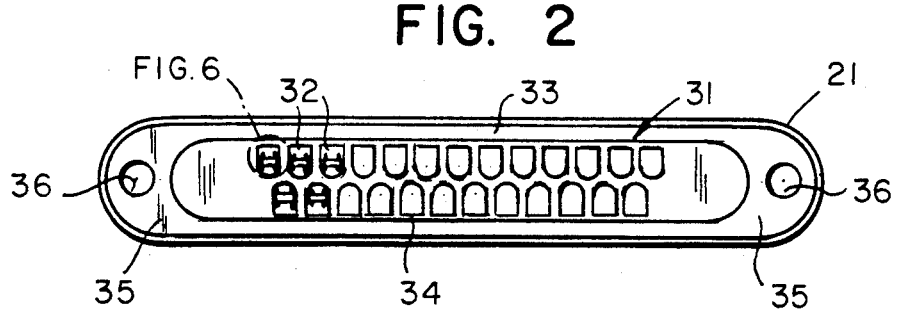
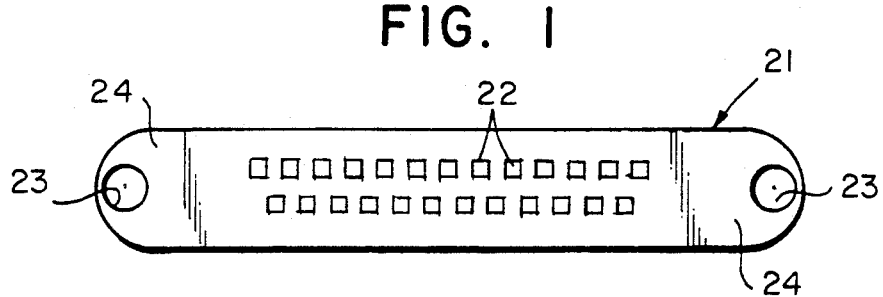

FIG. 6
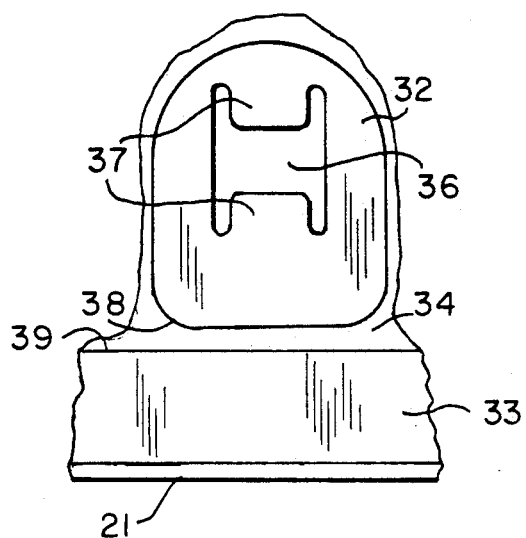
FIG. 7
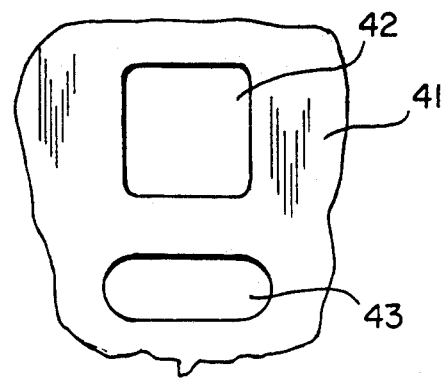
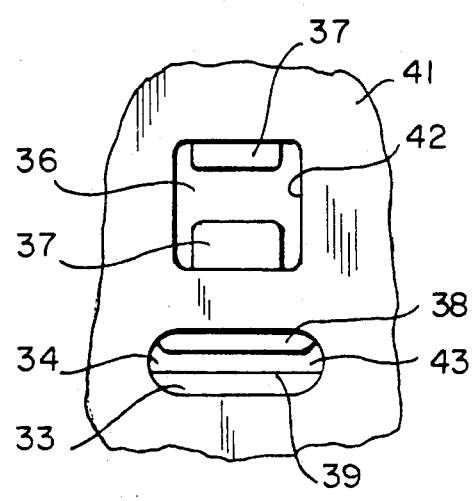
FIG. 8
FIG. 9
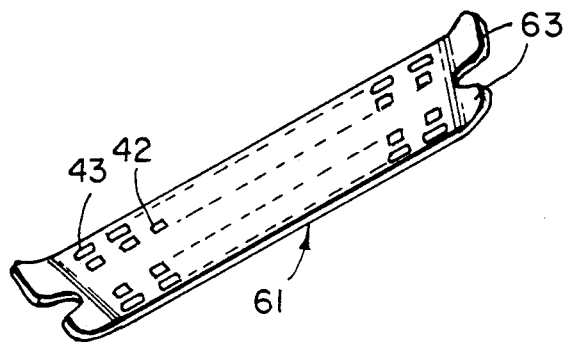

ELECTRICAL OVERSTRESS PULSE PROTECTION

SUMMARY OF THE INVENTION

The present invention relates to the protection of electrical and electronic circuits from high energy electrical overstress pulses that might be injurious or destructive to the circuits, and render them non-functional, either permanently or temporarily. Suitable non-linear compositions and composite formulations of materials are known which can be connected to, or incorporated as part of an electrical circuit, and are characterized by high electrical resistance when exposed to low or normal operating voltages, but essentially instantaneously switch to low electrical resistance in response to an excessive or overstress voltage pulse, thereby shunting the excessive voltage or overstress pulse to ground. The present invention relates particularly to structural arrangements for the inclusion of those non-linear materials into electrical circuits, and more specifically into electrical connectors.

The materials utilized in practicing the present invention are designed to respond substantially instantaneously to the leading edge of an overstress voltage pulse by changing their electrical characteristics, and by shunting the pulse to ground, to reduce the transmitted voltage of the pulse to a much lower value, and to clamp the voltage at that lower value for the duration of the pulse. These materials are also capable of substantially instantaneous recovery to their original high resistance value on termination of the overstress pulse, and of repeated responses to repetitive overstress pulses. For example, these materials can be designed to provide an ohmic resistance in the megohm range in the presence of low applied voltages in the range of 10 to more than 100 volts. However, upon the application of a sudden overstress pulse of, for example, 4,000 volts, these materials essentially instantaneously drop in resistance and switch to a low impedance shunt state that reduces the overstress pulse to a value in the range of a few hundred volts, or less, and clamps the voltage at that low value for the duration of the pulse. In the present description, the high resistance state is called the "off-state", and the low resistance condition under overstress is called the "on-state".

Overstress responsive compositions are known in the art, and in general, they constitute a mixture or composite of finely divided electrically conductive and semi-conductive particles supported in fixed spaced relation to each other in an electrically insulative resin binder or matrix. The most effective of these compositions or composites is described in U.S. Pat. No. 4,992,333. The entire teaching of said application is incorporated herein by reference. In general, said composite comprises a mixture of different micron sized particles of conductive and semiconductive materials with angstrom sized spacer particles, which are densely packed and bound with an insulative resin matrix. Other electrical overstress compositions are described and illustrated in other prior art patents.

U.S. Pat. No. 2,273,704 to R. O. Grisdale discloses a granular composite material having a non-linear voltage-current characteristic. This patent discloses a mixture of conductive and semiconductive granules that are coated with a thin insulative film (such as metal oxides), and are compressed and bonded together in a matrix to provide stable, intimate and permanent contact between the granules.

U.S. Pat. No. 4,097,834 to K. M. Mar et al. provides an electronic circuit protective device in the form of a thin film non-linear resistor, comprising conductive particles surrounded by a dielectric material, and coated onto a semiconductor substrate.

U.S. Pat. No. 2,796,505 to C. V. Bocciarelli discloses a non-linear precision voltage regulating element comprised of conductor particles having insulative oxide coatings thereon that are bound in a matrix. The particles are irregular in shape, and are point contiguous, i.e. the particles make point contact with each other.

U.S. Pat. No. 4,726,991 to Hyatt et al. discloses an electrical overstress protection material, comprised of a mixture of conductive and semiconductive particles, all of whose surfaces are coated with an insulative oxide film, and which are bound together in an insulative matrix, wherein the coated particles are in contact, preferably point contact, with each other.

Additional patents illustrative of the prior art in respect to this general type of non-linear resistor are U.S. Pat. No. 2,150,167 to Hutchins et al., U.S. Pat. No. 2,206,792 to Stalhana, U.S. Pat. No. 3,864,658 to Pitha et al., and U.S. Pat. No. 4,977,357 and U.S. Pat. No. 5,068,634 to Shrier.

As illustrated in the foregoing prior art, the overstress responsive compositions are usually positioned as a bulk material between a pair of contraposed electrodes having large areas facing each other, and the compositions are confined or clamped between the electrode structures. Because the matrix binder usually and preferably is a resin, the compression force applied during assembly of the electrodes and the composition affects the electrical properties of the resultant unit, and in use, changes in compression due to structural expansion and contraction likewise affects the electrical properties. Thus, both the off-state resistance and on-state resistance of these devices can vary, as well as the value of the overstress voltage at which the devices will switch from off-state to on-state and the voltage at which the overstress pulse is clamped for its duration.

The copending patent application of Roger C. Stephenson and Hugh H. Hyatt, Ser. No. 666,026, filed Mar, 7, 1991 now U.S. Pat. No. 5,183,698 issued Feb. 2, 1993, provides a structure wherein the aforesaid difficulties are mitigated and effectively eliminated, and in addition, certain performance improvements are obtained. That application utilizes an edge electrode for at least one of the electrodes, and in certain embodiments both may be edge electrodes. To this end, said at least one electrode is formed from or with a thin metal lamina, and the thin edge of the lamina is used as the face of the electrode. This thin edge is placed in spaced contraposed relation to the face of the second electrode, and the latter face may itself be a thin edge, or it may be a relatively large flat surface area, or it may be the curved face of a cylindrical electrode such as a connector pin. The non-linear resistance composite material is interposed between the two electrode faces and makes electrical contact therewith. In the preferred arrangement, the thickness of the thin edge electrode(s) is less than the spacing between the electrodes. Because of this geometry, the interposed composite material is not subjected to the compressive action of contraposed large area electrode surfaces. In addition, the edge effect of the electrode enhances the local electric field and causes the composite material to switch from its off-state to its on-state earlier in the presence of an overstress electrical pulse, than with a comparable device where the contraposed faces of the electrodes present large areas. Also, when in the off-state, the resistance of the interposed composite is greater than with a comparable structure where the contraposed faces of the electrodes present large areas.

The thin lamina electrode may be a printed circuit element or ground plane, which would place its thickness at about 0.2 to 35 mils; or it may be a self-sustaining metal foil, which would place its thickness in the range of about 1 to 50 mils; or it may be a thin metal sheet of 50 mils or greater, preferably, but not limited to, up to about a tenth of an inch.

The present invention is an improvement over the teachings of said Stephenson and Hyatt application, and is an adaptation of the teachings thereof, useful particularly for application to electrical connectors. In accordance with the present invention a very thin, and preferably flexible laminate is formed, comprising an insulative substrate lamina carrying a printed or etched conductive lamina on one surface with a second insulative covering lamina placed over the conductive lamina. The conductive lamina includes two types of conductive elements: the first type is a connector pin-engaging pad, and the second type is a ground plane or strip. Normally, there is a separate apertured pad for each pin, which is designed to slide over the respective pin axially, and frictionally to engage and make electrical contact with the pin. The ground plane is electrically separate from the pads but is configured to have an edge located closely adjacent an edge of each pad. The space between each pad and the ground plane is bridged with an appropriate overstress composite material, such as aforedescribed. Thus, if an overstress electrical pulse appears at one or more of the connector pins, it turns the composite to its on-state and is thus shunted to ground via the ground plane.

The aforesaid laminate is preferably formed of flexible laminae, and is shaped to conform to the connector housing, with the pads arranged to conform to the pin configuration. The insulative substrate and cover laminae are provided with holes or apertures that also conform with the pad apertures and connector pin configuration. Thus, the laminate is readily applied as an overlay to a completely fabricated connector for which it is designed, by being positioned over the pins of the connector, and then slid axially along the pins to their base. One or more terminals are provided on the ground plane for making electrical contact with a ground connection, which may be one of the connector pins or the connector housing. Although the laminate is contemplated as best adapted for application to a connector, the principle of the invention is applicable to other circuit structures.

Accordingly, it is one object of the present invention to provide a laminate or overlay adapted to be applied to an electrical circuit element for inclusion of an electrical overstress pulse responsive composite material in the electrical circuit of the element.

Another object of the present invention is to provide such a laminate adapted to be applied over the pins of an electrical circuit connector for inclusion of an electrical overstress pulse responsive composite material in the circuit of the connector.

Still another object of the present invention is to provide a planar overlay adapted to be applied to a circuit element, such as over the pins of an electrical connector, for inclusion of an electrical overstress pulse responsive composite material in the electrical circuit.

And a further object of the invention is to provide such an overlay formed as a flexible laminate of a pattern of electrically conductive elements and an electrically insulating carrier therefor, with an electrical overstress pulse responsive composite material interposed between portions of said conductive elements.

Other objects and advantages of the present invention will become apparent to those skilled in the art from a consideration of the illustrative specific embodiments of the invention provided in the following detailed description, had in conjunction with the accompanying drawings, in which like reference characters refer to like or corresponding parts.

DESCRIPTION OF DRAWINGS

FIG. 1 is plan view of a substrate lamina used in the present invention;

FIG. 2 is a plan view of the substrate lamina with a conductive lamina applied thereto;

FIG. 3 is a plan view of a cover lamina to be applied over the conductive lamina shown in FIG. 2;

FIG. 4 is an edge view of the assembled laminae of FIGS. 1, 2 and 3;

FIG. 5 is a plan view of the assembled laminae of FIGS. 1, 2 and 3;

FIG. 6 is an enlarged view of a portion of FIG. 2;

FIG. 7 is an enlarged view of a portion of FIG. 3;

FIG. 8 is an enlarged view of a portion of FIG. 5;

FIG. 9 is a perspective view of a modified form of the invention;

DETAILED DESCRIPTION

Figure 10:
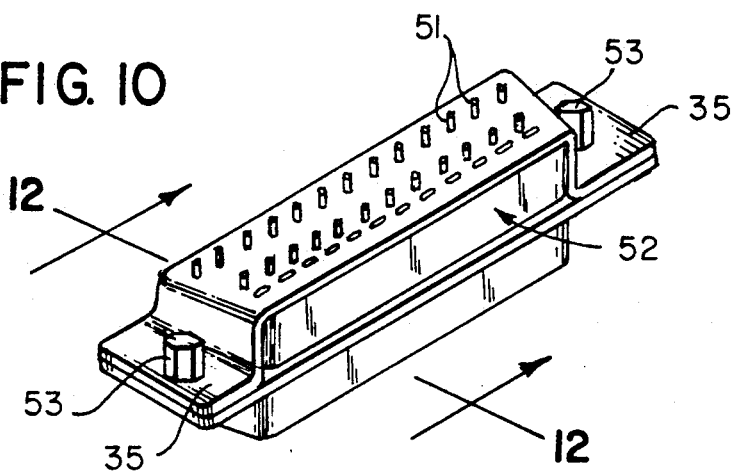
FIG. 10 is a perspective view of a connector with the embodiment of the invention as shown in FIG. 1-5 applied thereto.

Referring to the drawings, FIGS. 1 to 5 show the overlay laminate per se, as comprising three layers or laminae. Substrate 21 is shown in FIG. 1, and is formed of an electrical insulation film, such as Kapton or other flexible resin material. The electrically conductive elements of the overlay are preferably formed by etching a metallic conductive layer adhered to the substrate. The resultant conductive lamina 31 is shown in FIG. 2, applied to the substrate 21, and includes the conductive pads 32 and the encircling ground plane or ground strip 33. The ground strip 33 preferably surrounds the pattern of pads 32, and the pads are located so that an edge of each pad is adjacent to, but still slightly spaced from an edge of the ground strip, as shown at 34. In the form shown in FIG. 2, the two ends of the ground strip are formed with projecting tabs 35, each having a hole 36. The tabs and holes are designed to facilitate grounding connection for the ground strip 33, as will be described subsequently.

The form of the pads 32 is shown in the enlarged fragmentary view of FIG. 6. Each pad has a central opening 36, and is formed with opposed tabs 37 that project into the opening 36. The purpose of this pair of tabs is frictionally to engage a connector pin, when one is inserted in the opening 36, to make good electrical contact, as will be explained below. FIG. 6 also shows the spacing 34 between the opposed edges 38 and 39 of the tab 32 and ground strip 33.

The etched conductor elements 32 and 33 on the substrate 21 are covered by thin insulative film 41, which may be Kapton or any other suitable flexible resin material. The cover 41 is shown in FIG. 3.

The resulting laminate thus comprises three thin superposed layers 21, 31 and 41 as shown in FIG. 4. The cover lamina 41 has a series of openings 42 which correspond to the same series of openings 22 in the substrate, and when the three laminae are properly superposed as in FIGS. 4 and 5, the openings 22 and 42 correspondingly align with the openings 36 in each of the pads 32. While the openings 22 and 42 in the substrate and cover are the same size, and are at least as large as the cross section of the connector pin to be received therein, as shown in FIG. 2 and the enlarged fragmentary views of FIGS. 6 and 8, the tabs 37 of pads 32 project into the area of those openings.

In addition to the pin receiving openings 42 in the cover lamina 41, there is an additional small opening 43 associated with and adjacent to each opening 42. Each opening 43 spans an edge portion 38 of the pad under the respective opening 42 and an adjacent edge portion 39 of the ground strip 33, along with the small spacing 34 between the pad and strip, as is best shown in the enlarged fragmentary view of FIG. 8.

Figure 12:
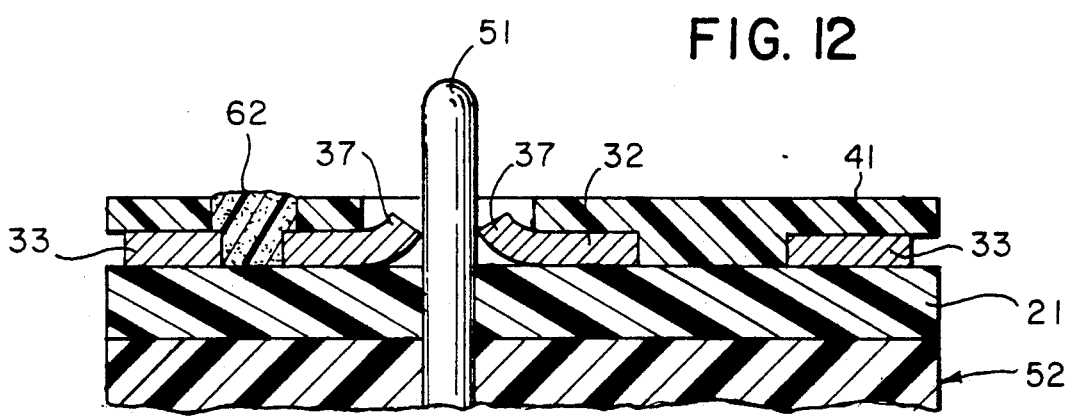
FIG. 12 is a cross sectional view of FIG. 10 taken along the line 12—12.

After this laminate has been assembled and the laminae are adhered together, each of the openings 43 in the cover 41 is filled with an electrical overstress pulse protection composite 62 (see FIG. 12) of the general type aforedescribed. The composite is applied in a sufficiently fluid state as to enter the space 34 between edges 38 and 39 of pads 32 and ground strip 33. This may be done, for example, by painting or by silk screening the composite onto the cover 41 of the laminate through a screen pattern that corresponds to the assembled openings 43. This is illustrated in the cross section of FIG. 12, showing the completed laminate applied over the pins of a connector, as in FIG. 10.

With the laminate now completed, it may be applied over an array of connector pins 51. The pin array must, of course, correspond to the pattern of openings and apertured pads in the laminate. The laminate is then driven or slid axially along the connector pins down to the base of the pins and resides as an overlay on the base of the connector 52, as shown in FIG. 10. In so doing, the tabs 37 on pads 32 are bent and resiliently engage the respective pins 51 to make good electrical contact therewith.

It will be observed that the holes 36 in the ground strip tabs 35 are smaller than than the holes 23 in the substrate tabs 24. The holes 36 and tabs 35 overlie the holes 23 and the tabs 24, and the ends of cover lamina 41 terminate short of the tabs. Thus, when assembled to a connector of corresponding configuration as shown in FIG. 10, the conductive tabs 35 are firmly engaged or grounded to the connector housing by threaded bolts 53 which pass through holes 23 and 36 and engage and press against the conductive tabs 35. There is thus provided the potential for a conductive path from any of the connector pins 51 to its respective pad 32, across the electrical overstress responsive composite 62 bridging gap 34, to ground strip 33, and thence through tab 35 to ground.

Figure 11:
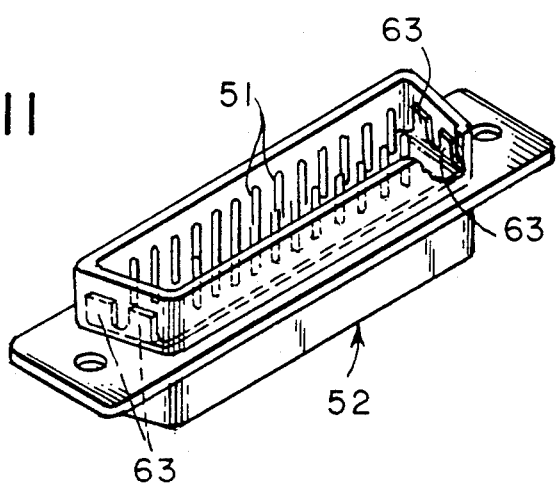
FIG. 11 is a perspective view of a connector with the embodiment of the invention as shown in FIG. 9 applied thereto.

An alternative form of the invention is shown in FIGS. 9 and 11. The basic structure of the flexible overlay 61 is the same as in the foregoing embodiment, except the ends or grounding tabs are different. In the embodiment of FIG. 9, the substrate, etched conductive lamina, and cover lamina are all essentially coextensive, except the ground plane or strip has resilient fingers 63 protruding from the ends of the laminate. Thus, when this laminate is applied over the pins of a shielded pin connector, such as in FIG. 11, and is slid over the pins to the base of the connector, the protruding clips 63 engage the inside of the connector shield, to effect a potential ground connection for the connector pins in in the same way as the preceding embodiment.

As the electrical overstress pulse responsive composite material, the following compositions are most useful for filling the small gaps 34 and the small holes 43.

| Material | Particle Size (less than) | Vol. % |
| --- | --- | --- |
| Example I | | |
| 304 stainless steel | 45 microns | 22 |
| Zinc oxide | 5 microns | 10 |
| Silicon carbide | 20 microns | 10 |
| Liquid Silicone (viscosity less than 500 cps) | | 58 |
| Example II | | |
| 304 stainless steel | 45 microns | 22 |
| Zinc oxide | 5 microns | 10 |
| Silicon carbide | 20 microns | 10 |
| Expoxy resin plus catalyst (viscosity about 7000 cps) | | 58 |

In both examples, the ingredients are degassed and mixed to form a substantially homogenous composite, and the product is then applied by silk-screening or painting through the holes 43 in cover 41 into the gap 34 between edges 38 and 39. In order to avoid any short circuits across the composite materials, the gap 34 should be greater than 1.5 times the maximum conductor particle size, or twice the mean particle size, which ever is larger. The response of the composite material to electrical overstress pulses and the clamping voltage obtained is, of course, a function of the composition of the composite and the size of the gap 34, and for each application the laminate of the invention may be tailored accordingly.

Thus, in accordance with the present invention there is provided a flexible connector overlay, which is applied over the pins of a prefabricated standard connector. The overlay is, of course, formed to accord with any desired connector design. Once applied to the connector, it provides protection to the circuits of which the connector is a part, against high voltage electrical overstress pulses by shunting the pulses to ground and clamping the pulse voltage at some voltage level that will not harm the circuit. This has been accomplished by the overlay laminate structure specifically shown and described in the foregoing specification and accompanying drawings. The present invention, however, is not limited to the embodiments herein shown and described, and various modifications will be apparent to those skilled in the art, as well as adaptations to other circuit elements than connectors. Such modifications and adaptations as are embraced by the spirit and scope of the appended claims are contemplated as being within the purview of the present invention.

What is claimed is:

1. An electrical overstress pulse arrester in the form of an overlay, comprising an electrically insulating substrate, an electrically conductive ground plane on said substrate, a separate electrically conductive pad on said substrate, and an electrically insulative cover over said ground plane and pad, said pad and said ground plane having spaced adjacent edges, said pad having an aperture therein, said substrate having an aperture underlying said pad aperture, said cover having a first aperture overlying said pad aperture and a second aperture overlying said spaced adjacent edges, said ground plane having ground connecting means, and an electrical overstress pulse responsive composite material located in said second cover aperture and interconnecting said pad and said ground plane, said composite material having the characteristics of a high electrical resistance in the presence of a low voltage applied across said material and a low electrical resistance in the presence of a high voltage applied across said material.

2. An electrical overstress pulse arrester as set forth in claim 1, said pad aperture, substrate aperture and first cover aperture being adapted to receive a conductive circuit element therethrough, and said pad having electrical contact means for engaging said conductive circuit element.

3. An electrical overstress pulse arrester as set forth in claim 1, having a plurality of said pads, each pad having said aperture and said edge spaced from and adjacent an edge of said ground plane, said substrate having a plurality of said apertures underlying the pad apertures, said cover having a plurality of said first apertures overlying the pad apertures and a plurality of said second apertures overlying the plurality of said spaced adjacent edges, and said composite material located in said plurality of second cover apertures.

4. An electrical overstress pulse arrester as set forth in claim 3, the pad apertures, substrate apertures and first cover apertures being adapted to receive a plurality of conductive circuit elements therein, and said pads having electrical contact means for engaging said conductive circuit elements.

5. An electrical overstress pulse arrester as set forth in claim 1, wherein said overlay is a thin flexible laminate.

6. An electrical overstress pulse arrester for pin connectors in the form of an overlay, comprising an electrically insulating substrate, an electrically conductive lamina on said substrate comprising a ground plane and a separate pad, and an electrically insulative cover over said lamina, said ground plane and said pad having spaced adjacent edges, said pad having an aperture for receiving therethrough the pin of a connector, said pad having means for electrically engaging said pin when received therethrough, said substrate and said cover each having an aperture located in correspondence with the aperture in said pad for receiving said pin therethrough, one of said substrate and cover having a second aperture coincident with said spaced edges, said ground plane having ground connecting means, and an electrical overstress pulse responsive composite material located in said second aperture interconnecting said spaced edges, said composite material having the characteristics of a high electrical resistance in the presence of a low voltage applied across said material and a low electrical resistance in the presence of a high voltage applied across said material.

7. An electrical overstress pulse arrester as set forth in claim 6, having a plurality of apertured pads, said substrate and cover each having a plurality of apertures located in correspondence with said plurality of apertured pads for receiving a plurality of connector pins therethrough, and a plurality of said second apertures.

8. An electrical overstress pulse arrester as set forth in claim 7, wherein said overlay is a thin flexible laminate.

9. In combination, a connector having a plurality of pins and a laminate overlayed on said pins, said laminate overlay comprising an electrically insulating substrate, an electrically conductive lamina on said substrate comprising a ground plane and a plurality of separate pads, and an electrically insulating cover over said lamina, said pads each having an edge adjacent an edge of said ground plane and spaced therefrom, each pad having an aperture and the substrate and cover each having a set of apertures in correspondence with the pad apertures receiving said pins, one of said substrate and said cover having a second set of apertures coincident with said spaced edges for each pad, and an electrical overstress pulse responsive composite material located in said second set of apertures interconnecting said spaced edges, said composite material having the characteristics of a high electrical resistance in the presence of a low voltage applied across said material and a low electrical resistance in the presence of a high voltage applied across said material.

10. In the combination as set forth in claim 9, means coupling said ground plane to a ground element on said connector.

11. In the combination as set forth in claim 9, said laminate being thin and flexible.

12. In the combination as set forth in claim 9, each of said pads having means for electrically engaging the respective pin received in the respective aperture.

13. A laminate for forming an electrical overstress pulse arrester by overlay on a circuit element, comprising an electrically insulating substrate, an electrically conductive ground plane and a separate electrically conductive pad on said substrate, said ground plane and said pad having spaced adjacent edges, said pad and said substrate having superposed apertures therein for receiving a portion of said circuit element, and electrical overstress pulse responsive composite material located between and connecting said spaced adjacent edges, said composite material having the characteristics of a high electrical resistance in the presence of a low voltage applied across said material and a low electrical resistance in the presence of a high voltage applied across said material.

14. A laminate as set forth in claim 13, and further including an electrically insulating cover over said ground plane.

15. A laminate as set forth in claim 13, and further including ground connecting means for said ground plane and circuit element connecting means for said pad.

16. A laminate for forming an electrical overstress pulse arrester by overlay on a circuit element, comprising an electrical insulating carrier, an electrically conductive ground plane laminated to said carrier, an electrically conductive pad laminated to said carrier in spaced adjacent relation to said ground plane, and an electrical overstress pulse responsive composite material located between said ground plane and pad and connecting an edge of one to the other, said pad and carrier having aligned apertures for receiving a portion of said circuit element therein, said pad having means for making electrical contact with said portion of said circuit element, said ground plane having means for making a ground connection.

17. A laminate as set forth in claim 16, which is thin and flexible.

18. A laminate as set forth in claim 16, and including a plurality of said pads, the carrier having a set of apertures corresponding to the apertures of the plurality of pads, said composite material being located between said ground plane and each of said pads and connecting an edge of one to the other.

19. A laminate as set forth in claim 18, in combination with a multipin connector, the pins of said connector passing through said apertures of said pad and said carrier.

* * * * *